(12) United States Patent
Bosch

(10) Patent No.: US 7,340,872 B2
(45) Date of Patent: Mar. 11, 2008

(54) METHOD OF AND DEVICE FOR PACKAGING ELECTRONIC COMPONENTS THUS PACKAGED

(75) Inventor: Johannes Wilhelmus Dorotheus Bosch, Wijchen (NL)

(73) Assignee: NXP, B.V., Eindhoven (NL)

( * ) Notice: Subject to any disclaimer, the term of this patent is extended or adjusted under 35 U.S.C. 154(b) by 356 days.

(21) Appl. No.: 10/497,644

(22) PCT Filed: Nov. 25, 2002

(86) PCT No.: PCT/IB02/05190

§ 371 (c)(1),
(2), (4) Date: Jun. 4, 2004

(87) PCT Pub. No.: WO03/049522

PCT Pub. Date: Jun. 12, 2003

(65) Prior Publication Data
US 2005/0035025 A1    Feb. 17, 2005

(30) Foreign Application Priority Data
Dec. 5, 2001  (EP) .................................. 01204684

(51) Int. Cl.
*B65B 7/28* (2006.01)
*B65B 1/04* (2006.01)
(52) U.S. Cl. .............................. 53/471; 53/473; 53/255
(58) Field of Classification Search .................. 53/450, 53/467, 471, 473, 553, 591, 592, 255; 206/713, 206/716, 820
See application file for complete search history.

(56) References Cited

U.S. PATENT DOCUMENTS

| | | | |
|---|---|---|---|
| 4,575,995 A | 3/1986 | Tabuchi et al. | |
| 5,150,787 A * | 9/1992 | Bird et al. | 206/714 |
| 5,203,143 A | 4/1993 | Gutentag | |
| 5,524,765 A | 6/1996 | Gutentag | |
| 5,589,029 A | 12/1996 | Matsui et al. | |
| 5,857,572 A | 1/1999 | Bird et al. | |
| 6,202,292 B1 * | 3/2001 | Farnworth et al. | 29/743 |
| 6,370,750 B1 * | 4/2002 | Matsumura et al. | 29/33 M |

FOREIGN PATENT DOCUMENTS

DE            10032415 A1    10/2001

* cited by examiner

*Primary Examiner*—J. Gregory Pickett
(74) *Attorney, Agent, or Firm*—Peter Zawilski

(57) ABSTRACT

The invention relates to a method of packaging an electronic component such as semiconductor device, where by the component is positioned in a cavity of a foil by tweezers and is supported by means of a further foil which is attached to the foil at one side thereof. According to an example embodiment, the component is first placed into the cavity of the foil by the tweezers, and only after that is the further foil positioned adjacent thereto and attached to the foil. The tweezers are moved through the foil to pick up the component, hold it, and move it into the cavity. A feature of this embodiment is that the component may be temporarily supported by a supporting means after being positioned in the cavity and before being attached to the further foil, and the foil with the component is moved in a longitudinal direction (L) of the foil.

9 Claims, 2 Drawing Sheets

METHOD OF AND DEVICE FOR PACKAGING ELECTRONIC COMPONENTS THUS PACKAGED

Figure 1:
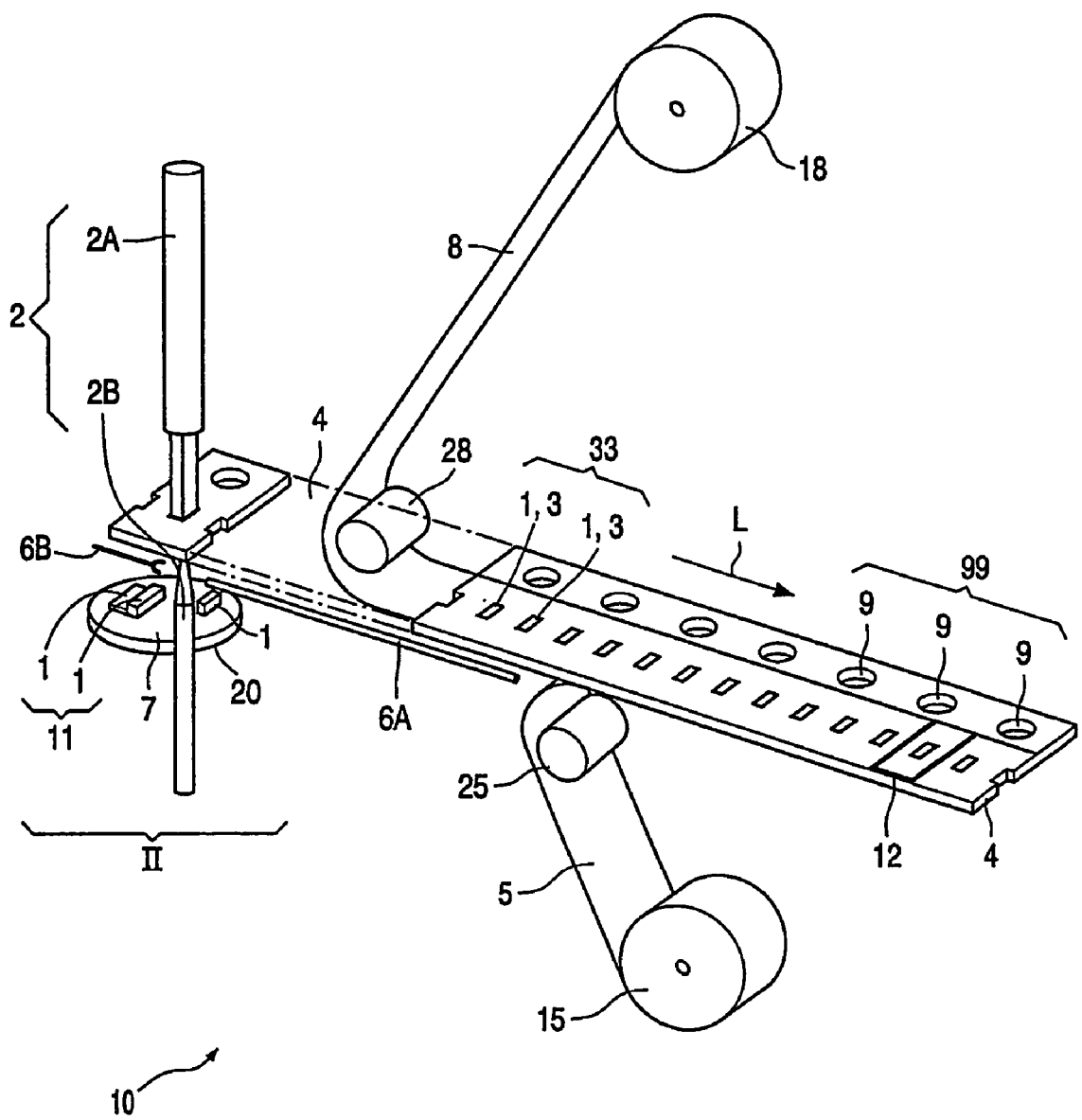

The invention relates to a method of packaging an electronic component whereby the component is positioned in a cavity of a foil by a pair of tweezers and is supported or retained by a further foil which is attached to the foil at one side thereof. The invention also relates to a packaged component thus obtained and to a device for implementing said method.

A large number of components, especially semiconductor components, can be packaged easily, quickly, and inexpensively with such a device.

Such a method is known from US patent published Jun. 11, 1996 under no. U.S. Pat. No. 5,524,765. It is disclosed therein how a component, in particular a semiconductor component, is packaged in that it is positioned in a cavity of a foil whose lower side is provided with a further foil with an adhesive layer at the side of the cavity, to which layer the component adheres (temporarily). Reference is also made to the use of a vacuum pipette and possibly an expeller needle for removing the component from the packaging. Such a method is known from U.S. Pat. No. 5,203,143 published Apr. 20, 1993. In this publication, the component rather rests on or is supported by the further foil. Enclosing of the component in the packaging is then achieved, if so desired, in that another foil is fastened to the foil at a side thereof opposed to the further foil. A device with which such a method can be implemented is known, for example, from U.S. Pat. No. 5,589,029 published Dec. 31, 1996. A component is moved from an elastic membrane, on which a number of components are present, to a foil by means of a vacuum pick up, which foil may be, for example, a foil as described in the patents cited above.

It is a disadvantage of the known method (and device) that the packaging speed is comparatively low, which limits the manufacturing output or raises the cost price.

It is accordingly an object of the present invention to provide a method by which the component can be quickly packaged and which in addition is intrinsically simple and inexpensive.

According to the invention a method of the kind mentioned in the opening paragraph is characterized in that first the component is positioned in the cavity in the foil by means of the tweezers, and only then is the further foil attached to the foil. This renders it possible to move the tweezers through the cavity in the foil during gripping of the component. The invention is based on the recognition that various surprising advantages are provided thereby. The main advantage is that the components, for example in the form of a preferably two-dimensional array of components glued to an elastic carrier, can be present very close to the foil, while the tweezers are present at an opposite side of the foil and can grip the component through the foil. The path traveled by the tweezers is a minimum, which promotes the speed of the method, the more since the tweezers need perform only a single, linear, reciprocating movement. The invention is further based on the recognition that, once the component is in the cavity of the foil, it can be ensured in a simple manner that the component remains in the cavity of the foil. This may be realized, for example, in that a temporary support for the component is provided next to or around the tweezers at the side of the foil where the force of gravity acts on the component. It is alternatively possible for the component to be temporarily supported by the tweezers themselves, or at least to be kept in place thereby.

In a preferred embodiment of a method according to the invention, after positioning of the component in the cavity and before providing of the further foil, the foil with the component therein is displaced in a longitudinal direction of the foil, during which the component is supported by supporting means which are present close to the foil at that side thereof to which the further foil will be attached. The supporting means comprise, for example, a roller belt. In addition thereto or instead thereof, supporting means in the form of a furcate member may be advantageously used. The tweezers, or at least a portion thereof, may be passed through the furcate member. It is alternatively possible for the furcate member to be arranged around the tweezers—or the portion thereof—after the latter have been passed through the cavity in the direction of the component. As was noted above, a temporary support may alternatively be provided by the tweezers themselves.

In a particularly favorable embodiment of a method according to the invention, the component is moved into the cavity from a position below that side of the foil to which the further foil will be attached. The tweezers—or at least the major portion thereof—will be at the other side of the foil in this case. After the tweezers have been removed, the foil may be provided with another (covering) foil also at this side, if so desired, so that the component is enclosed in the cavity of the foil. If the further foil is provided with an adhesive layer, the retention of the component in the cavity of the foil can be realized with the use of exclusively the further foil.

Preferably, the components are formed in a two-dimensional array on an elastic membrane and are moved therefrom to within the cavity in the foil by means of an exclusively reciprocal movement of the tweezers. The tweezers may comprise a single tubular member with an open end, which is coupled to a vacuum arrangement. The component may then be sucked up by the tweezers acting as a vacuum pipette and pulled loose from the elastic membrane, If so desired, a needle situated opposite the tubular member may be used during this, by means of which the component is pushed off the membrane. The membrane may or may not be pierced locally by the needle during this.

In a particularly favorable embodiment, the tweezers are formed by two needles which are positioned on either side of the foil, and the component is moved to between said needles. The component may thus be gripped and displaced carefully and without being contaminated. Preferably, one of the needles is given an obtuse end, whereas the other needle is given a sharp end. The latter needle is then preferably located behind the membrane on which the component or components is or are present, while the other needle is provided above the component. As little damage as possible is inflicted on the component during packaging as a result of this. The needles may be moved towards the component synchronously or asynchronously. While the component is being displaced towards the cavity, the two needles are obviously moved in synchrony. The two needles preferably move in a single, linear, reciprocal movement, as was noted above.

Preferably, the component is enclosed in the cavity of the foil in that yet another foil is provided on the foil at the other side, in addition to the further foil. This results in a particularly safe and clean packaging of the component. Both the further and the other foil, if present, may be attached to the foil by gluing. All foils are preferably made of paper. Alternatively, however, they may be made from a synthetic resin and may or may not comprise a laminate. The material of the foils may also be electrically conductive for the purpose of ESD (=Electro Static Discharge) protection.

In a favorable modification, the further foil and, if present, the other foil are fastened to the foil by means of a roller, during which the other foil, if present, is preferably fastened to the foil from a different lateral position of the foil than that from which the further foil is provided. A method according to the invention may thus be readily automated, and a device with which the method is implemented may be compact and yet accessible and reliable.

The foil used is preferably strip-shaped and provided with an array of cavities, each for one or several electronic components, and with an array of sprocket holes for transport of the foil in its longitudinal direction. A method according to the invention is particularly suitable for packaging discrete or integrated semiconductor devices. One or several semiconductor devices may be packaged in each cavity. The invention also relates to an electronic component packaged by a method according to the invention.

In addition, the invention also relates to a device for packaging an electronic component, provided with a holder for the electronic component, a foil holder for a foil provided with a cavity, a further foil holder for providing a further foil against one side of the foil, which further foil supports or retains the component, and tweezers by which the electronic component can be taken from the holder and can be placed in the cavity of the foil, wherein according to the invention the tweezers and the further foil holder are positioned and constructed such that first the component can be placed in the cavity in the foil by the tweezers, and only then can the further foil be fastened to the foil. A method according to the invention can be implemented in a simple manner with such a device.

Preferably, the device is provided with transport means for the foil and with supporting means for supporting the component in the cavity of the foil before the further foil is provided. In a major modification, the supporting means comprise a roller belt and/or a furcate member which is preferably displaceable parallel to the foil.

Preferably, the holder for the component comprises an elastic membrane on which an array of components is present, adhered thereto by a layer of glue.

Preferably, the tweezers comprise two needles which are present on either side of the foil during operation. Preferably, one of the two needles has an obtuse end and the other one a sharp end, while the needles are movable exclusively in a direction substantially perpendicular to the foil.

Figure 2:
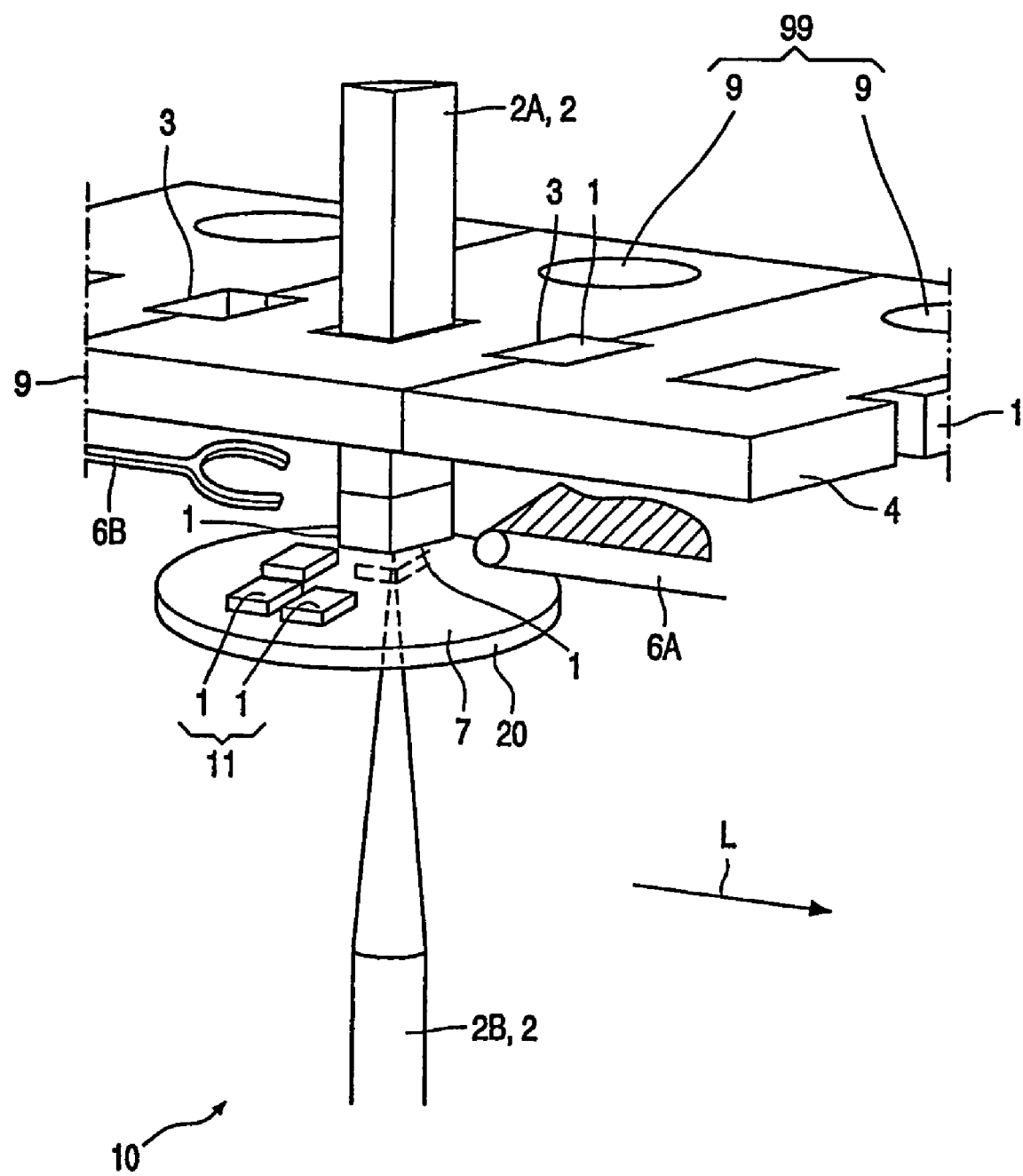

The invention will now be explained in more detail below with reference to an embodiment and an accompanying drawing, in which FIG. 1 diagrammatically and in perspective view shows a device according to the invention for implementing a method according to the invention in an implementation stage thereof, and FIG. 2 diagrammatically and in perspective view shows a portion of the device of FIG. 1 denoted II therein.

The Figures are not drawn to true to scale, and some dimensions have been particularly exaggerated for the sake of clarity. Corresponding regions or components have been given the same reference numerals as much as possible.

FIG. 1 diagrammatically and in perspective view shows a device according to the invention for implementing a method according to the invention in an implementation stage thereof, and FIG. 2 shows a portion of the device denoted II in FIG. 1 in the same manner. The device 10 in this example comprises a holder 20 provided with an electronic component 1, here in the form of a ring with a membrane 7 thereon on which an array of components 1, i.e. discrete semiconductor elements 1 such as diodes or transistors 1, is present. Above this there is a foil holder (not individually shown in the drawing) with—at least during operation—a foil 4, strip-shaped in this case, which is provided with a cavity 3 for packaging the semiconductor elements 1. At one side of the foil 4, there is a further foil holder 15 for a further foil 5, here in the form of a reel 15 around which said further foil 5 is wound. In this example, another foil holder 18, also in the form of a reel 18 around which another foil 8 is wound, is present, also at the other side of the foil 4. The further foil 5 and the other foil 8 are conducted to the foil 4 via further rollers 25, 28. After the semiconductor element 1 has been introduced into a cavity 3 of the foil 4, at least the further foil 5 is provided on the foil 4, by gluing in this case, and the element 1 will rest at least temporarily on said further foil 5. In the present example, another foil 8 is additionally glued to the foil 4, so that eventually the element 1 will be enclosed in the foil 4. The device 10 further comprises tweezers 2 by which the component 1 can be taken from the holder 20 and can be placed in the cavity 3 of the foil 4.

According to the invention, the tweezers 2 and the further foil holder 15 are positioned and constructed such that first the component 1 can be placed in the cavity in the foil 4 by the tweezers 2, and only afterwards can the further foil 5 be attached to the foil 4. Since the further foil 5 is not yet attached to the foil 4 at the moment the component 1 is introduced into the recess 3, the tweezers can move freely through the foil during this. This renders it possible to position the component holder 20 close to the foil 4 and to carry out merely a short, linear, reciprocal movement with the tweezers 2 for gripping the component 1. This makes the device 10 compact, fast, and reliable.

The device 10 further comprises supporting means 6 for supporting the component 1 in the cavity 3 of the foil 4 before the further foil 5 is provided. The supporting means 6 in this example comprise a roller belt 6A which at the same time acts as transport means 6A for transporting the foil 4 through the device 10 and which is for this purpose provided with projections (not shown) which engage holes 9 provided in the foil 4 for the purpose of said transport, outside the regions of the foil 4 in this case where the latter is covered by the further foil 5 and the other foil 8.

In this example, the tweezers 2 comprise two needles 2A, 2B, solid needles in this case, between whose free ends the component 1 is gripped and moved towards the foil 4. The needle 2A present above the component 1 and at the side of the foil 4 where the other foil 8 will be provided has an obtuse end, so that the pressure exerted on the component 1 is small, and thus also the risk of damage. The tweezers 2 further comprise a solid needle 2B provided with a sharp end and located behind the membrane 7 of the component holder 20, whereby on the one hand the component 1 is pressed from the membrane 7—whether or not in combination with piercing of the membrane 7—and whereby on the other hand the component 1 is gripped in cooperation with the needle 2A and is transported to the cavity 3 in the foil 4. Gripping and displacing of a component 1 in this manner can thus take place in an easy, fast, and clean manner, i.e. without the component becoming polluted thereby.

The supporting means 6 in this example also comprise a furcate member 6B which is preferably parallel to the foil 4, as in the present case. The member 6B may surround the needle 2B and may support the component 1 temporarily and protect it from dropping while said needle 2B is being pulled away. FIG. 2 shows this more clearly, also on account of an enlarged scale of the drawing in this Figure. The Figure shows the situation in which the component 1 held between the needles 2A, 2B is on its way from the membrane 7 to the cavity 3 in the foil 4. The dimensions of various components of the device 10 are as follows: the foil 4 is 8 mm wide and 0.6 mm thick. The dimensions of a cavity 3 are approximately 1×1 mm$^2$, in which case the dimensions of a component 1 will be, for example, slightly less than 1×1 mm$^2$. The diameter of the needle 2B will have a gradient from a few mm to a few tenths of a mm. The needle 2A is approximately 1×1 mm$^2$. The width of the further foil 5 and of the other foil 8 is 5 mm here, and all foils 4, 5, 8 are made of paper in this case.

The device 10 is operated as follows by a method according to the invention. After an array 11 of components 1 has been brought into the device 10 close to the foil holder provided with a foil 4 having cavities 3, a component 1 is moved from the component holder 20 to within the cavity 3 of the foil 4 by the tweezers 2, see FIG. 2. The needle 2A, approaching from above, passes through the cavity 3 twice: once for going to the component 1 and a second time while inserting the component 1 into the cavity 3. At that moment the supporting means 6B, i.e. the furcate member 6B, is capable of supporting the component 1 after performing a translatory movement to below said component, so that the needle 2B can be detached from the component. The foil 4 may now be displaced by means of the roller belt 6A (see FIG. 1), during which the component 1 may rest on the roller belt 6A. Immediately after the end of the roller belt 6A, the further foil 5 from the further foil holder 15 is glued to the foil 4 by means of a roller 25 at one side of the foil 4, here at the lower side thereof, which further foil 5 takes over the task of supporting the component 1.

In a similar manner another foil 8 is adhered to the foil 4, at the other side of the foil 4, so that the component 1 is enclosed in the cavity 3 of the foil 4. The further foil 5 and the other foil 8 are glued to the foil 4 at different moments in this example, corresponding to their different locations in the device 10, which has various advantages, for example as regards space and accessibility. In the example given, the other foil 8 is first provided, and after that the further foil 5. This may also take place in reverse order. FIG. 1 shows how a series of packages 12 is thus formed from the foil 4, each containing one or several components 1 and capable of being wound onto a reel (not shown) so as to be delivered to a customer.

The invention is not limited to the embodiment described as many variations and modifications are possible to those skilled in the art within the scope of the invention, both as regards the method and as regards the device.

Thus the tweezers may comprise a single needle, for example in the form of a vacuum pipette. The component need not necessarily be situated below the foil. A component turned upside down, in comparison with the Figure, may alternatively be above the foil, in which case the component can be taken from the holder and placed in the cavity of the foil by means of tweezers consisting of a single needle, as discussed in this paragraph, or with two needles as in the embodiment.

The invention claimed is:

1. A method of packaging an electronic component whereby the component is positioned in a cavity of a foil by a pair of tweezers and is supported or retained by a further foil which is attached to the foil at one side thereof wherein first the component is positioned in the cavity in the foil by means of the tweezers, and only then is the further foil attached to the foil;

wherein after positioning of the component in the cavity and before providing of the further foil, the foil with the component therein is displaced in a longitudinal direction (L) of the foil, during which the component is supported by supporting means which are present close to the foil at that side thereof to which the further foil will be attached; and wherein the supporting means comprise a furcate member.

2. The method as recited in claim 1, wherein the component is moved into the cavity from a position below that side of the foil to which the further foil will be attached.

3. A method of packaging an electronic component whereby the component is positioned in a cavity of a foil by a pair of tweezers and is supported or retained by a further foil which is attached to the foil at one side thereof, characterized in that first the component is positioned in the cavity in the foil by means of the tweezers, and only then is the further foil attached to the foil; and wherein the component is provided in the form of a two-dimensional array on an elastic membrane and is moved therefrom to within the cavity in the foil by means of an exclusively reciprocal movement of the tweezers.

4. The method as recited in claim 1, wherein the tweezers are formed by two needles which are positioned on either side of the foil, and the component is moved to between said needles.

5. The method as recited in claim 4, wherein one of the two needles has an obtuse end and the other one a sharp end.

6. The method as recited in claim 1, wherein another foil is provided at a side of the foil which is situated opposite the side to which the further foil is attached.

7. The method as recited in claim 1, wherein the further foil and, if present, the other foil are fastened to the foil by means of a roller, during which the other foil if present, is preferably fastened to the foil from a different lateral position of the foil than that from which the further foil is provided.

8. The method as recited in claim 1, wherein the foil is strip-shaped and provided with an array of cavities, each designed for one or several electronic components, and with an array of holes designed for transport of the foil in the longitudinal direction (L) thereof.

9. The method as recited in claim 1, wherein a semiconductor device, or a discrete semiconductor device, is chosen as the electronic component.

* * * * *